(12) United States Patent
Arisaka et al.

(10) Patent No.: US 11,115,031 B2
(45) Date of Patent: Sep. 7, 2021

(54) PHASE-LOCKED LOOP

(71) Applicant: Sony Semiconductor Solutions Corporation, Kanagawa (JP)

(72) Inventors: Naoya Arisaka, Tokyo (JP); Tetsuya Fujiwara, Kanagawa (JP); Shinichirou Etou, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/976,670

(22) PCT Filed: Feb. 15, 2019

(86) PCT No.: PCT/JP2019/005554
§ 371 (c)(1),
(2) Date: Aug. 28, 2020

(87) PCT Pub. No.: WO2019/167670
PCT Pub. Date: Sep. 6, 2019

(65) Prior Publication Data
US 2021/0006255 A1 Jan. 7, 2021

(30) Foreign Application Priority Data
Mar. 2, 2018 (JP) .............................. JP2018-037428

(51) Int. Cl.
*H03L 7/089* (2006.01)
(52) U.S. Cl.
CPC .................................. *H03L 7/0895* (2013.01)
(58) Field of Classification Search
CPC ... H03L 7/0895; H03L 7/087; H03L 7/70992; H03L 2207/50; H03M 1/466; H03M 3/458; H03K 5/2481
(Continued)

(56) References Cited

U.S. PATENT DOCUMENTS 5,982,221 A * 11/1999 Tuthill ..................... G01K 7/01
257/E23.08
6,097,239 A * 8/2000 Miranda, Jr. ............ G01K 7/01
327/512
(Continued)

FOREIGN PATENT DOCUMENTS

JP 09-153773 A 6/1997
JP 2017-163546 A 9/2017

OTHER PUBLICATIONS

S. Kundu, et al., "A 0.2-to-1.45GHz Subsampling Fractional-N. All-Digital MDLL with Zero-Offset Aperture PD-Based Spur Cancellation and In-Situ Timing Mismatch Detection," ISSCC 2016 / Session 19 / Digital PLLs / 19.2, University of Minnesota, Minneapolis, MN, pp. 326-328, Feb. 3, 2016.

(Continued)

*Primary Examiner* — John W Poos
(74) *Attorney, Agent, or Firm* — Michael Best & Friedrich LLP

(57) ABSTRACT

The present technology relates to a phase-locked loop that allows a reduction in power consumption.
A SAR-ADC that includes two capacitors and outputs a result of comparison between voltages generated from the two capacitors, a current source that charges the two capacitors with current, a first switch that is disposed between one of the two capacitors and the current source and is provided with a phase difference between a first clock of a reference frequency and a second clock having a higher frequency than the first clock, and a second switch that is disposed between another of the two capacitors and the current source and is provided with the second clock are included. The present disclosure can be applied, for example, to a wireless communication device.

7 Claims, 13 Drawing Sheets

(58) Field of Classification Search
USPC .................................... 327/147, 156, 158
See application file for complete search history.

(56) References Cited

U.S. PATENT DOCUMENTS

| | | | |
|---|---|---|---|
| 7,312,648 B2* | 12/2007 | Yang .................. | G01K 7/01 |
| | | | 327/512 |
| 9,285,778 B1 | 3/2016 | Evans et al. | |
| 2012/0032824 A1* | 2/2012 | Yoshioka .............. | H03M 1/125 |
| | | | 341/110 |
| 2016/0191035 A1 | 6/2016 | Neag et al. | |
| 2017/0131333 A1* | 5/2017 | Schapendonk ....... | H03M 3/458 |

OTHER PUBLICATIONS

Extended European Search Report dated Mar. 16, 2021 for corresponding European Application No. 19761589.1.
Xu, Zule et al., "A 0.84ps-LSB 2.47mW Time-to-Digital Converter Using Charge Pump and SAR-ADC", Proceedings of the IEEE 2013 Custom Integrated Circuits Conference, IEEE, Sep. 22, 2013 (Sep. 22, 2013), pp. 1-4, * Section: I I. Proposed Solution; figures I(b), 2 * XP032524632, DOI: 10 .1109/CI CC. 2013. 6658465 [retrieved on Nov. 7, 2013].

* cited by examiner

PHASE-LOCKED LOOP

TECHNICAL FIELD

The present technology relates to a phase-locked loop, and more particularly, relates to a phase-locked loop that allows a reduction in power consumption.

BACKGROUND ART

For the IoT era to come, power reduction of LSIs has been required. Of the power consumptions of analog blocks mounted on an LSI, the power consumption of a local oscillator accounts for a large proportion. Local oscillators include PLLs. Recently, all-digital PLLs (ADPLLs) have sometimes been used.

An ADPLL generates a DCO frequency from a digital set frequency data frequency command word (FCW) and an external reference frequency so as to satisfy the relationship DCO frequency=FCW×reference frequency. In order to match the ratio between the DCO frequency and the reference frequency to FCW, the ADPLL includes a counter circuit that detects an integer phase difference between a DCO frequency signal Fdco and a reference frequency signal Fref, and a time-to-digital converter (TDC) circuit that detects a fractional phase difference.

The counter circuit detects an integer phase difference by counting how many periods of Fdco are input within one period of Fref, and thus must be operating at all times for one period of Fref. On the other hand, the TDC circuit only needs to detect a phase difference between edges of Fref and Fdco, and thus does not need to continue operating at all times for one period of Fref, and can operate intermittently. The intermittent operation reduces average current consumption per hour, and thus allows power reduction.

The TDC circuit delays Fdco in several inverter circuit stages, and catches a rising edge of Fref with a latch circuit, thereby detecting a phase difference. This configuration is simple but difficult to operate at low power because it needs to operate a large number of inverter circuits to generate a delay when the phase difference between Fref and Fdco is large, leading to an increase in current consumption.

Thus, Non-Patent Document 1 proposes a TDC circuit designed to remedy increased power consumption. The TDC circuit generates a signal of a phase difference between Fref and Fdco in a phase detector (PD), and charges a capacitor C1 with current from a charge pump (CP) for the time of the phase difference signal to obtain a voltage $V_F$.

Furthermore, after obtaining the voltage $V_F$, the TDC circuit charges a capacitor C2 with current from the CP to generate a voltage $V_{RAMP}$, and counts the number of pulses of Fdco (count number: n) until the voltage $V_F$ and the voltage $V_{RAMP}$ intersect in a single-slope ADC (SS-ADC). The capacitor C1 and the capacitor C2 are 1:N. Thus, the slopes of the voltage $V_F$ and the voltage $V_{RAMP}$ are N:1. Thus, n/N is an AD converted value and is a phase difference between Fref and Fdco.

CITATION LIST

Non-Patent Document

Non-Patent Document 1: Somnath Kundu, Bongjin Kim, Chris H. Kim, "19.2 A 0.2-to-1.45 GHz Subsampling Fractional-N All-Digital MDLL with Zero-Offset Aperture PD-Based Spur Cancellation and In-Situ Timing Mismatch Detection", 2016 IEEE International Solid-State Circuits Conference, Feb. 3, 2016, [online] [searched on Jan. 25, 2018], the Internet <URL: http://www.ee.umn.edu/groups/VLSIresearch/papers/2016/ISSCC16_MDLL.pdf>

SUMMARY OF THE INVENTION

Problems to be Solved by the Invention

However, in the proposal of Non-Patent Document 1, when the phase difference between Fref and Fdco is large, it is necessary for the CP to continue operating for several Fdco clocks before the voltage $V_F$ and the voltage $V_{RAMP}$ are obtained. Consequently, the intermittent rate during one period of Fref becomes low, making it difficult to sufficiently reduce power.

The present technology has been made in view of such circumstances, and allows a reduction in power consumption.

Solutions to Problems

A phase-locked loop according to one aspect of the present technology includes a SAR-ADC that includes two capacitors and outputs a result of comparison between voltages generated from the two capacitors, a current source that charges the two capacitors with current, a first switch that is disposed between one of the two capacitors and the current source and is provided with a phase difference between a first clock of a reference frequency and a second clock having a higher frequency than the first clock, and a second switch that is disposed between another of the two capacitors and the current source and is provided with the second clock.

According to one aspect of the present technology, a SAR-ADC that includes two capacitors and outputs a result of comparison between voltages generated from the two capacitors, a current source that charges the two capacitors with current, a first switch that is disposed between one of the two capacitors and the current source and is provided with a phase difference between a first clock of a reference frequency and a second clock having a higher frequency than the first clock, and a second switch that is disposed between another of the two capacitors and the current source and is provided with the second clock are included.

Effects of the Invention

According to the present technology, power consumption can be reduced.

It should be noted that effects described in the present description are merely examples. The effects of the present technology are not limited to the effects described in the present description, and may include additional effects.

MODE FOR CARRYING OUT THE INVENTION

Hereinafter, a mode for carrying out the present disclosure (hereinafter referred to as embodiments) will be described. The description will be made in the following order.
1. First embodiment (ADPLL)
2. Second embodiment (wireless communication device)

1. First Embodiment

<Configuration Example of ADPLL of the Present Technology>

Figure 1:
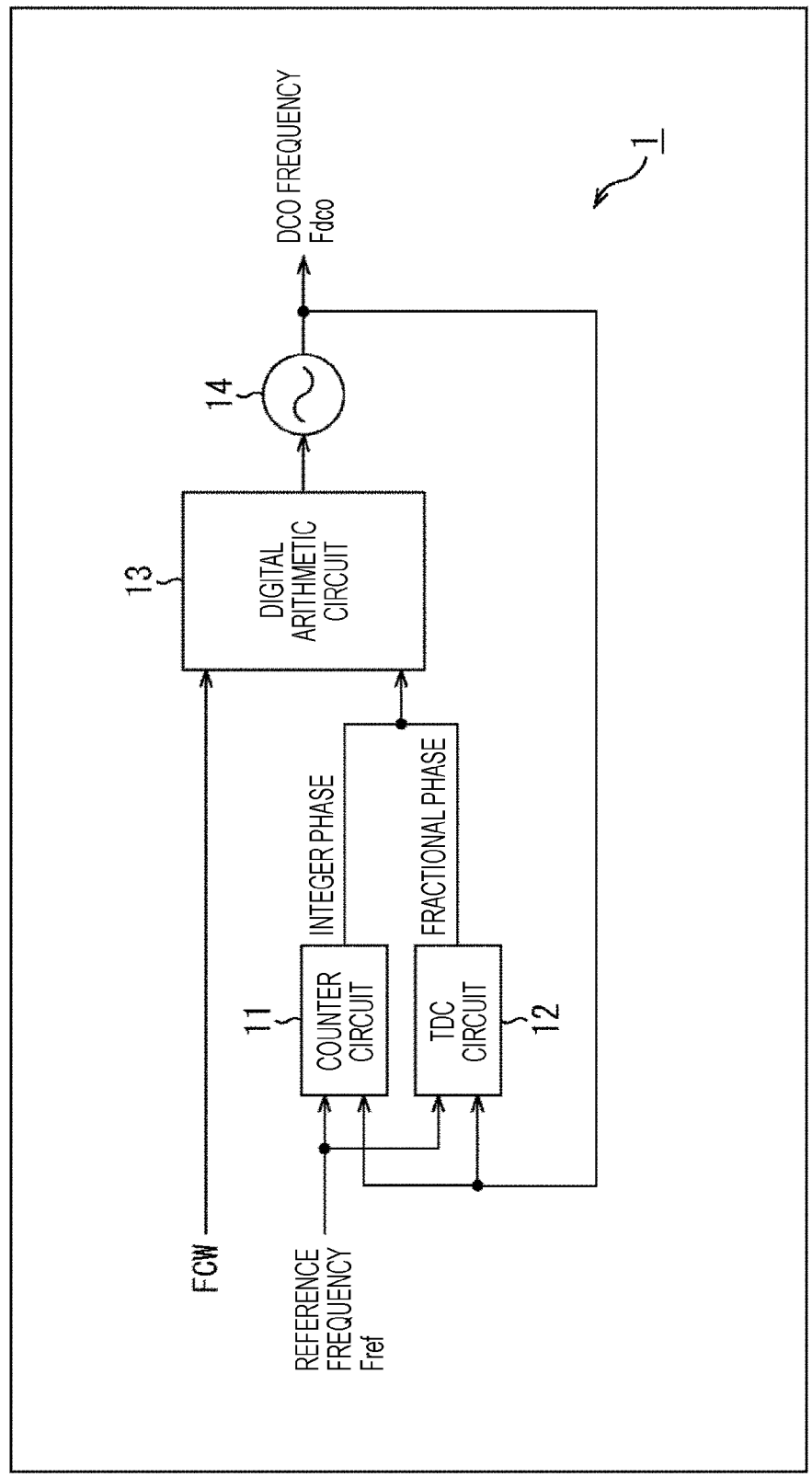
FIG. 1 is a block diagram illustrating a configuration example of an ADPLL to which the present technology is applied.

FIG. 1 is a block diagram illustrating a configuration example of an all-digital PLL (ADPLL) as a phase-locked loop to which the present technology is applied.

An ADPLL 1 illustrated in FIG. 1 generates, from a digital set frequency data frequency command word (FCW) and an external reference frequency, a digital-controlled oscrator (DCO) frequency that satisfies the relationship DCO frequency=FCW×reference frequency. The DCO frequency is a frequency higher than the reference frequency. The digital set frequency data FCW is data used to set the DCO frequency, and is provided from a control unit of a device including the ADPLL 1 or the like.

The ADPLL 1 includes a counter circuit 11, a time-to-digital counter (TDC) circuit 12, a digital arithmetic circuit 13, and a voltage-controlled oscillator (VCO) 14.

The reference frequency signal Fref is provided to the counter circuit 11 and the TDC circuit 12. The digital set frequency data FCW is provided to the digital arithmetic circuit 13.

The counter circuit 11 detects an integer phase difference between the reference frequency signal Fref provided externally and the DCO frequency signal Fdco provided from the VCO 14, and outputs a signal representing the detected integer phase difference to the digital arithmetic circuit 13.

The TDC circuit 12 detects a fractional phase difference between the reference frequency signal Fref provided externally and the DCO frequency signal Fdco provided from the VCO 14, and outputs a signal representing the detected fractional phase difference to the digital arithmetic circuit 13.

The digital arithmetic circuit 13 compares the signals representing the phase differences provided from the counter circuit 11 and the TDC circuit 12 with phase information obtained by time integration of the digital set frequency data FCW, and outputs the comparison result to the VCO 14 through a digital filter.

The VCO 14 outputs a signal of an oscillation frequency according to the comparison result provided from the digital arithmetic circuit 13 to a subsequent stage (not illustrated) as the DCO frequency signal Fdco. The DCO frequency signal Fdco is fed back to the counter circuit 11 and the TDC circuit 12.

<Operation Example of ADPLL>

Figure 2:
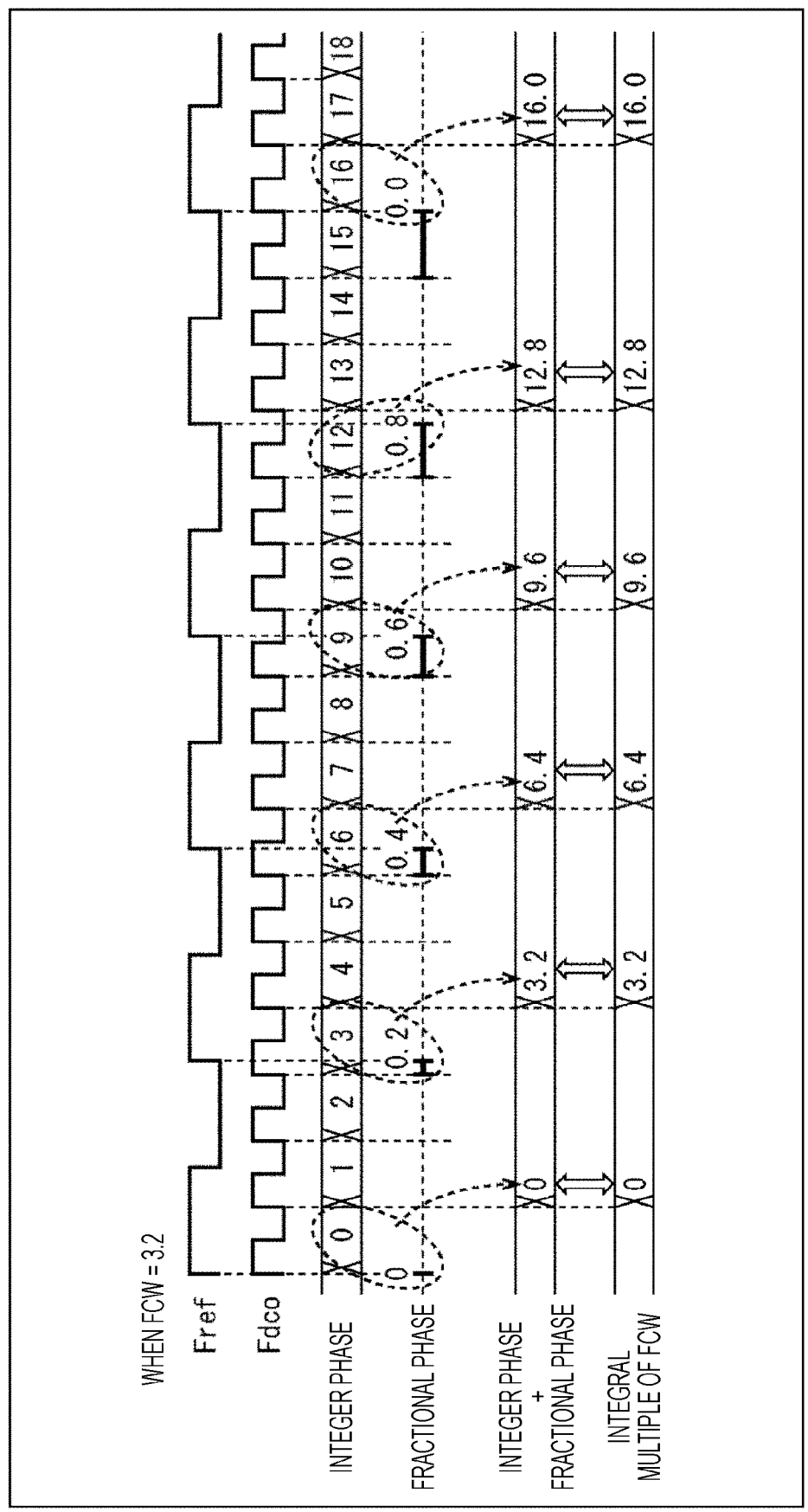
FIG. 2 is a diagram illustrating the operation of the ADPLL.

FIG. 2 is a diagram illustrating the operation of the ADPLL.

FIG. 2 illustrates an example where the digital set frequency data FCW=3.2. A signal waveform of the reference frequency signal Fref, a signal waveform of the DCO frequency signal Fdco, an integer phase detected in the counter circuit 11, and a fractional phase detected in the TDC circuit 12 are illustrated in the order from top. Furthermore, the values of the integer phase+the fractional phase and the values of integral multiples of the digital set frequency data FCW on which phase comparison is performed in the digital arithmetic circuit 13 are illustrated.

In the vicinity of the first rising edge of the reference frequency signal Fref, the integer phase of the DCO frequency signal Fdco is 0, and the fractional phase is also 0. Thus, the digital arithmetic circuit 13 performs a phase comparison between integer phase+fractional phase "0" and integer multiple "0" of the digital set frequency data FCW.

In the vicinity of the second rising edge of the reference frequency signal Fref, the integer phase of the DCO frequency signal Fdco is 3, and the fractional phase is 0.2. Thus, the digital arithmetic circuit 13 performs a phase comparison between integer phase+fractional phase "3.2" and integer multiple "3.2" of the digital set frequency data FCW.

In the vicinity of the third rising edge of the reference frequency signal Fref, the integer phase of the DCO frequency signal Fdco is 6, and the fractional phase is 0.4. Thus, the digital arithmetic circuit 13 performs a phase comparison between integer phase+fractional phase "6.4" and integer multiple "6.4" of the digital set frequency data FCW.

Note that processing on the fourth and subsequent rising edges is performed in a similar manner, and thus will not be repeatedly described.

<Explanation of Conventional Example for Comparison with the Present Technology>

Figure 3:
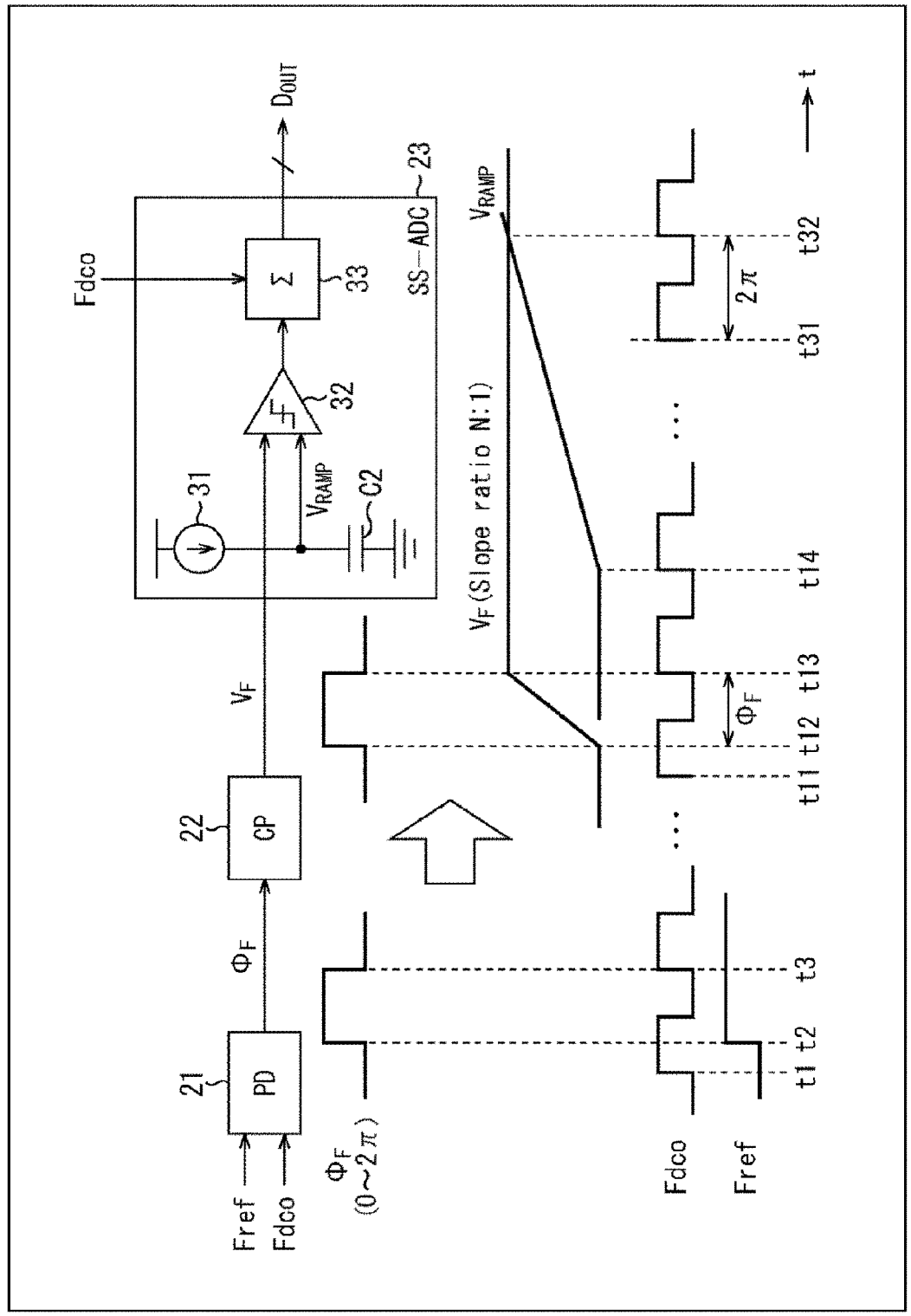
FIG. 3 is a diagram illustrating a conventional TDC circuit for comparison with the present technology.

FIG. 3 is a diagram illustrating a conventional TDC circuit for comparison with the present technology.

A TDC circuit illustrated in FIG. 3 includes a phase-locked loop (PD) 21, a charge pump (CP) 22, and a single-slope ADC (SS-ADC) 23.

The PD 21 generates a phase difference signal $\phi_F$ (0 to $2\pi$) between a reference frequency signal Fref and a DCO frequency signal Fdco.

While the phase difference signal $\phi_F$ is provided, the CP 22 charges a capacitor C1 (not illustrated) provided inside with current. A voltage $V_F$ that is a phase difference information voltage generated in the capacitor C1 due to the current charging by the CP 22 is output to the SS-ADC 23.

The SS-ADC 23 includes a capacitor C2 (C1:C2=1:N (N≥2)), a current source 31, a comparator 32, and an integrator 33. The voltage $V_F$ output from the capacitor C1 is provided to the comparator 32.

The current source 31 charges the capacitor C2 with current. A voltage $V_{RAMP}$ that is a period information voltage generated in the capacitor C2 due to the current charging of the current source 31 is output to the comparator 32.

The comparator 32 compares the voltage $V_F$ and the voltage $V_{RAMP}$, and outputs the comparison result to the integrator 33.

The integrator 33 counts the number of pulses of the DCO frequency signal Fdco until the voltage $V_F$ and the voltage $V_{RAMP}$ intersect (count number: n (n≥1)), and outputs an operation result $D_{out}$.

Since the capacitor C1 and the capacitor C2 are 1:N, the slopes of the voltage $V_F$ and the voltage $V_{RAMP}$ are N:1. n/N is an AD converted value, and is the phase difference between the reference frequency signal Fref and the DCO frequency signal Fdco.

FIG. 3 illustrates, below the configuration diagram, a signal waveform of the phase difference signal $\phi_F$, a signal waveform of the DCO frequency signal Fdco, a signal waveform of the reference frequency signal Fref, a Slope of the voltage $V_F$ generated in the capacitor C1, and a Slope of the voltage $V_{RAMP}$ generated in the capacitor C2 (Slope ratio N:1).

The operation of the TDC circuit will be described. The PD 21 generates the phase difference signal $\phi_F$ for the period between the time t2 of a rising edge of the reference frequency signal Fref and the time t3 of a subsequent rising edge of the DCO frequency signal Fdco, and outputs it to the CP 22.

The CP 22 charges the capacitor C1 with current while the phase difference signal $\phi_F$ is provided, that is, between the time t12 of a rising edge of the phase difference signal $\phi_F$ and the time t13 of a subsequent rising edge of the DCO frequency signal Fdco, so that the voltage $V_F$ is generated in the capacitor C1.

At the time t14 of a rising edge of the DCO frequency signal Fdco after a wait of one period after the end of charging of the capacitor C1 with current, the capacitor C2 is charged with current from the current source 31, so that the voltage $V_{RAMP}$ is generated in the capacitor C2.

The integrator 33 counts the number of pulses of the DCO frequency signal Fdco ($2\pi$ in the case of FIG. 1) (count number: n (n≥1)) until the voltage $V_{RAMP}$ matches the voltage $V_F$ in the comparator 32. At the time t32 of a rising edge of the DCO frequency signal Fdco when the voltage $V_{RAMP}$ matches the voltage $V_F$, the charging of the capacitor C2 with current from the current source 31 is finished, and the integrator 33 finishes counting and outputs the operation result $D_{out}$.

Figure 4:
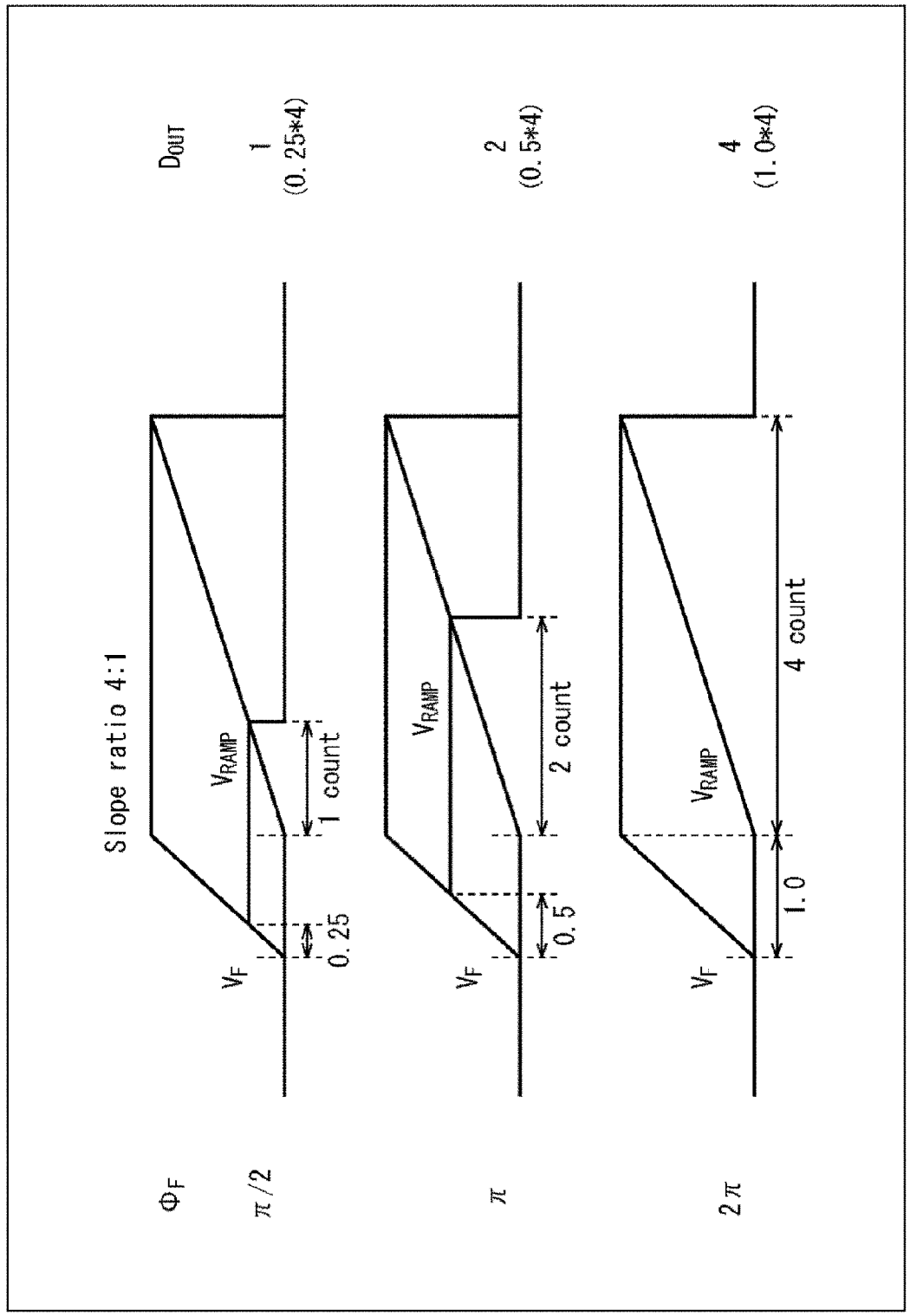
FIG. 4 is a diagram illustrating how to determine a fractional phase difference between a reference frequency signal Fref and a DCO frequency signal Fdco.

FIG. 4 is a diagram illustrating how to determine the fractional phase difference between the reference frequency signal Fref and the DCO frequency signal Fdco.

The example of FIG. 4 illustrates a case with Slope ratio 4:1.

The upper row illustrates an example when the phase difference signal $\phi_F$ is $\pi/2$, the DCO frequency signal Fdco is $2\pi$, and the operation result $D_{out}$ is 1. That is, a value of 0.25 obtained by dividing one count of the DCO frequency signal Fdco by four is the value of the phase difference signal $\phi_F$.

The middle row illustrates an example when the phase difference signal $\phi_F$ is $\pi$, the DCO frequency signal Fdco is $2\pi$, and the operation result $D_{out}$ is 2. That is, a value of 0.5 obtained by dividing two counts of the DCO frequency signal Fdco by four is the value of the phase difference signal $\phi_F$.

The lower row illustrates an example when the phase difference signal $\phi_F$ is $2\pi$, the DCO frequency signal Fdco is $2\pi$, and the operation result $D_{out}$ is 4. That is, a value of 1 obtained by dividing four counts of the DCO frequency signal Fdco by four is the value of the phase difference signal $\phi_F$.

Figure 5:
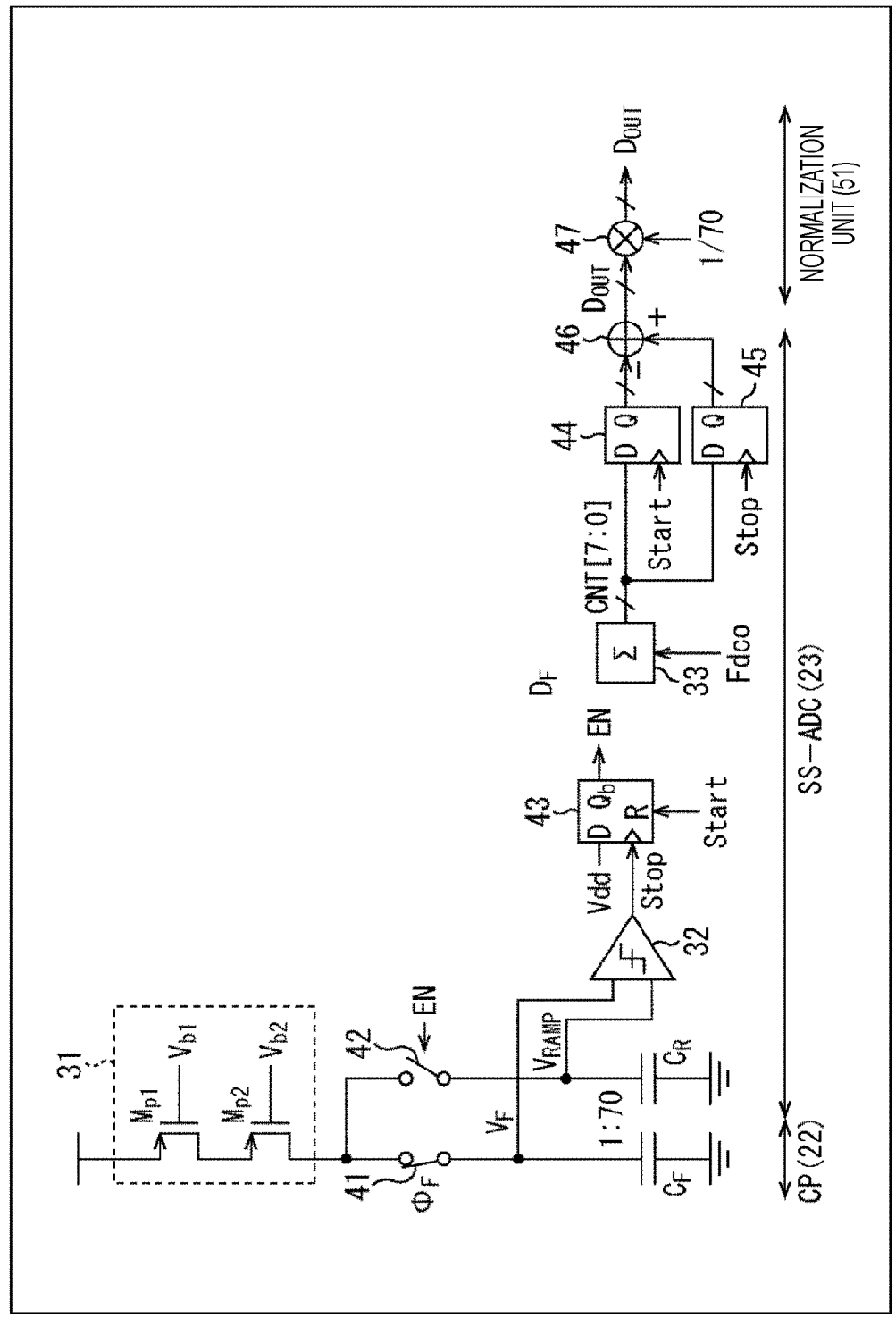
FIG. 5 is a diagram illustrating a configuration example of a conventional TDC circuit in a case where N=70 and n=69.

FIG. 5 is a diagram illustrating a configuration example of a conventional TDC circuit when the ratio of two capacitors is 1:N (N=70), and the number of counts of an integrator is n=69.

The TDC circuit illustrated in FIG. 5 includes a CP 22, an SS-ADC 23, and a normalization unit 51. In the example of FIG. 5, the ranges of arrows at the bottom indicate the configurations of the parts, and a PD 21 is omitted.

The CP 22 includes a current source 31, a switch 41, and a capacitor $C_F$.

The SS-ADC 23 includes the current source 31, a switch 42, a capacitor $C_R$, a comparator 32, a latch circuit 43, an integrator 33, a latch circuit 44, a latch circuit 45, and an arithmetic unit 46.

The current source 31 includes transistors $M_{p1}$ and $M_{p2}$, and is shared by the CP 22 and the SS-ADC 23 by means of switching of the switches 41 and 42.

While a phase difference signal $\phi_F$ is provided, the switch 41 is turned on, and the capacitor $C_F$ is charged with current from the current source 31. The resulting voltage $V_F$ in the capacitor $C_F$ is provided to the comparator 32.

Furthermore, while an enable signal EN is provided from the latch circuit 43, the switch 42 is turned on, and the capacitor $C_R$ ($C_F:C_R$=1:70) is charged with current from the current source 31. The resulting voltage $V_{RAMP}$ in the capacitor $C_R$ is provided to the comparator 32.

The comparator 32 compares the voltage $V_F$ and the voltage $V_{RAMP}$, and if the voltage $V_F$ and the voltage $V_{RAMP}$ match, it outputs a Stop signal to the latch circuit 43.

When the latch circuit 43 is provided with a Start signal that is output at the end of provision of the phase difference signal $\phi_F$, it outputs the enable signal EN to the switch 42.

The integrator 33 counts the number of pulses of the DCO frequency signal Fdco, and outputs the count number to the latch circuits 44 and 45.

The latch circuit 44 holds the count number when it is provided with the Start signal that is output at the end of provision of the phase difference signal $\phi_F$ (14 in FIG. 6 described later), and outputs it to the arithmetic unit 46 at a predetermined timing.

The latch circuit 45 holds the count number when it is provided with the Stop signal output from the comparator 32 (83 in FIG. 6 described later), and outputs it to the arithmetic unit 46 at a predetermined timing.

The arithmetic unit 46 outputs, to the normalization unit 51, an operation result $D_{out}$ that is a difference between the value provided from the latch circuit 44 and the value provided from the latch circuit 45.

The normalization unit 51 includes a multiplier 47. The multiplier 47 outputs, to a subsequent stage, a normalization result $D_F$ obtained by multiplying the operation result $D_{out}$ provided from the arithmetic unit 46 by 1/70.

Figure 6:
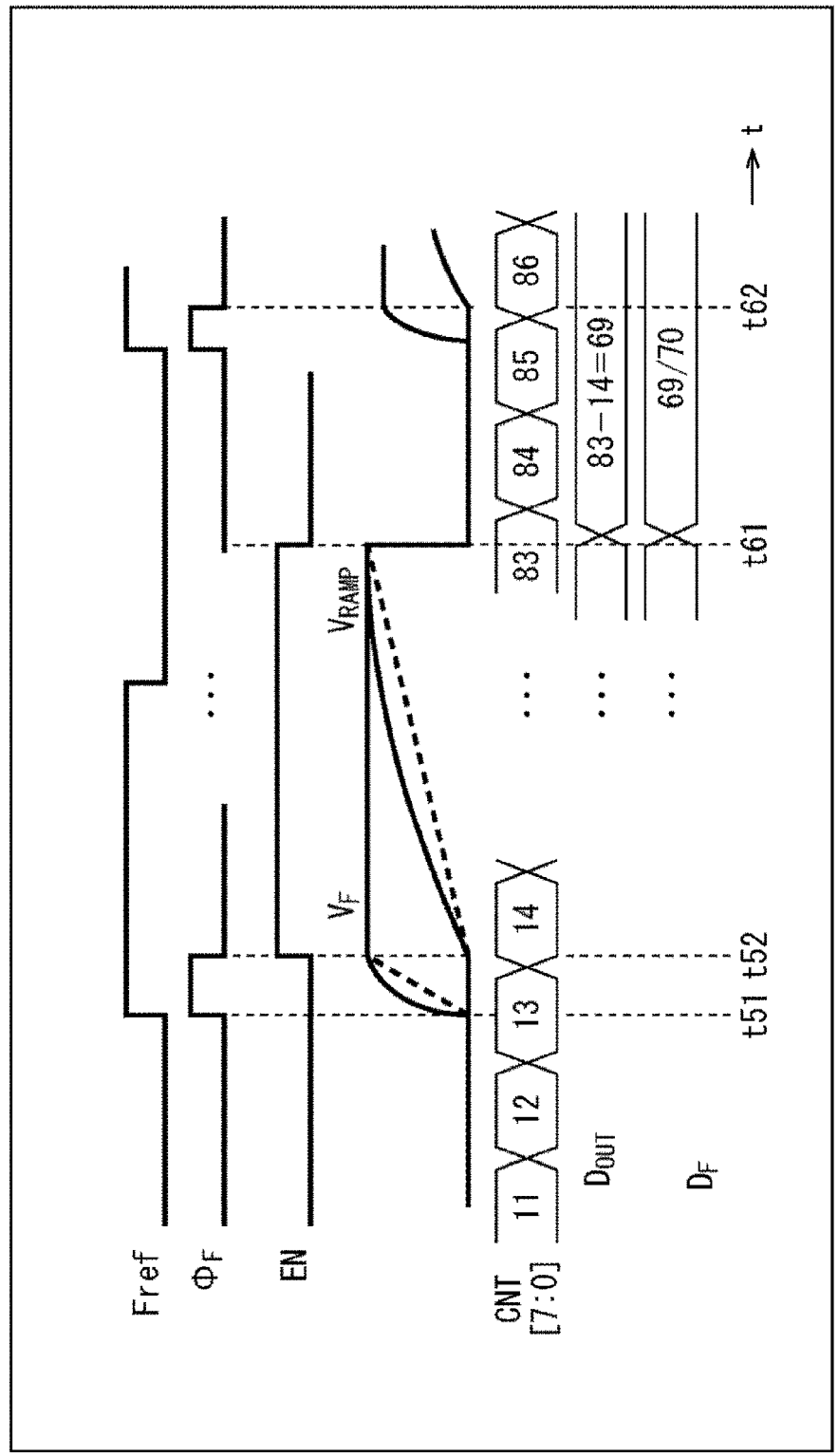
FIG. 6 is a diagram illustrating the operation of the TDC circuit in FIG. 5.

FIG. 6 is a diagram illustrating the operation of the TDC circuit in FIG. 5.

FIG. 6 illustrates, in the order from top, a signal waveform of the reference frequency signal Fref, a signal waveform of the phase difference signal $\phi_F$, a signal waveform of the enable signal EN, a Slope of the voltage $V_F$ generated in the capacitor $C_F$, and a Slope of the voltage $V_{RAMP}$ generated in the capacitor $C_R$ (Slope ratio 1:70). Note that neither Slope is actually linear as indicated by a solid line due to the influence of errors and the like. However, they are under the same conditions, and thus linear Slopes from which errors and the like are removed as indicated by broken lines are used at the time of comparison of the voltages.

Furthermore, below the Slopes, the count values of the integrator 33, the value of the operation result $D_{out}$, and the value of the normalization result $D_F$ are illustrated.

While the phase difference signal $\phi_F$ is provided from the time t51 of a rising edge of Fref, the capacitor $C_F$ is charged with current from the current source 31, and the voltage $V_F$ is generated in the capacitor $C_F$. The integrator 33 counts the number of pulses of the DCO frequency signal Fdco from the start of the DCO frequency signal Fdco, and continues to output the count number to the latch circuits 44 and 45. The latch circuit 44 holds the count value (14) at the time t52 of a rising edge of the enable signal EN caused by the Start signal output at the end of provision of the phase difference signal $\phi_F$.

The comparator 32 compares the voltage $V_F$ and the voltage $V_{RAMP}$, and outputs the Stop signal to the latch circuit 45 at a time t61 when the voltage $V_F$ and the voltage $V_{RAMP}$ match. The latch circuit 45 holds the count value (83) at the time t61.

The arithmetic unit 46 outputs, to the normalization unit 51, the operation result $D_{out}$ (69) that is the difference between the value (14) provided from the latch circuit 44 and the value (83) provided from the latch circuit 45.

The multiplier 47 outputs, to the subsequent stage, the normalization result $D_F$ (69/70) obtained by multiplying the operation result $D_{out}$ (69) provided from the arithmetic unit 46 by 1/70.

As described above with reference to FIGS. 5 and 6, if the phase difference between the reference frequency signal Fref and the DCO frequency signal Fdco is large, the conventional TDC circuit needs to continuously operate the CP or the current source for several clocks of the DCO frequency signal Fdco so as to obtain the voltage $V_{RAMP}$ and the voltage $V_F$. Consequently, the intermittent rate in one period of the reference frequency signal Fref is reduced, preventing sufficient power reduction.

<TDC Circuit of the Present Technology>

Figure 7:
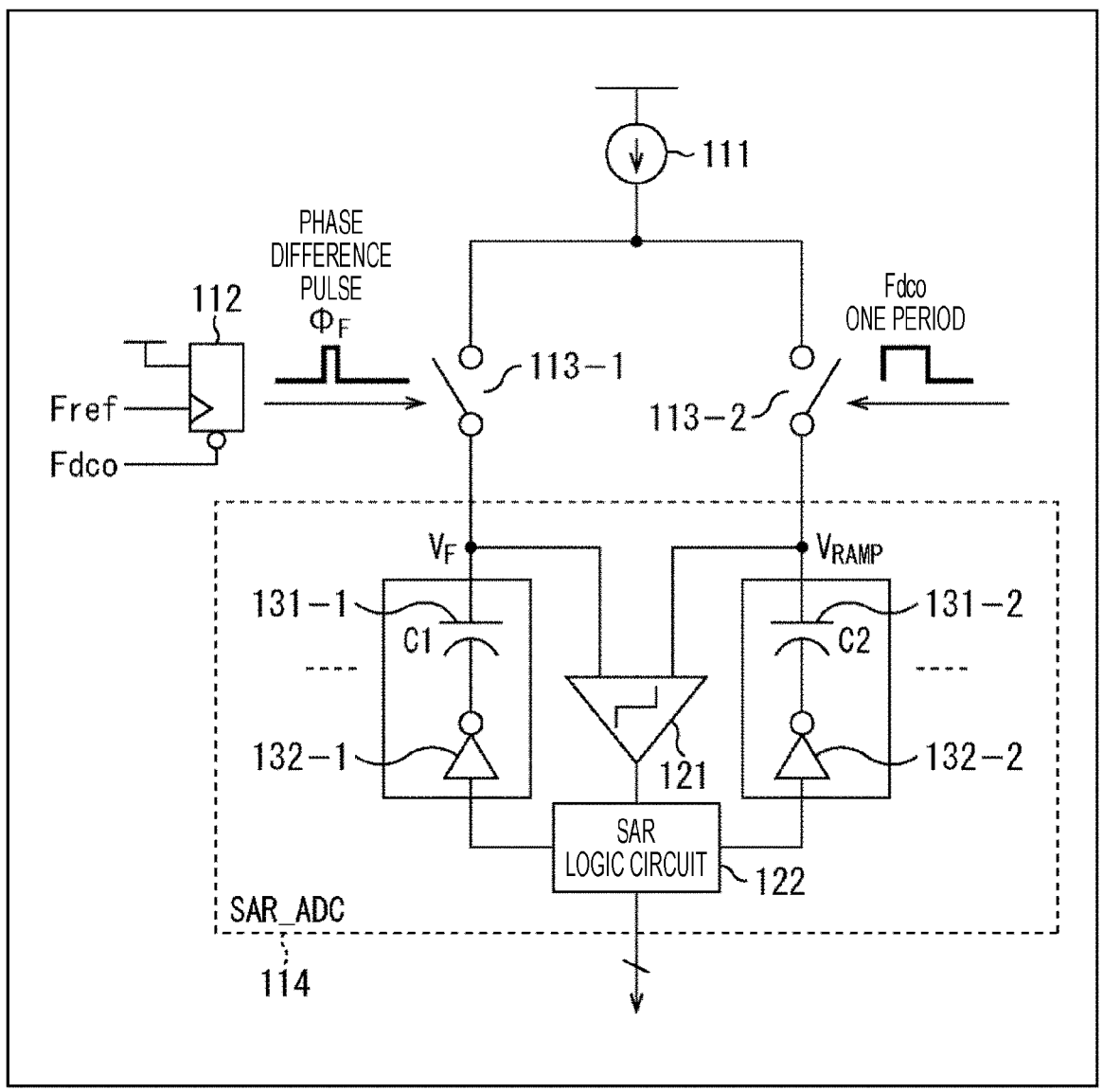
FIG. 7 is a circuit diagram illustrating a configuration example of the TDC circuit in FIG. 1.

FIG. 7 is a circuit diagram illustrating a configuration example of the TDC circuit in FIG. 1.

The TDC circuit 12 of FIG. 7 includes a current source 111, a PD 112, switches 113-1 and 113-2, and a successive approximation (SAR) ADC 114 including two capacitors.

The current source 111 charges a capacitor 131-1 with current, which is one of the two capacitors of the SAR ADC 114, via the switch 113-1. Furthermore, the current source 111 charges a capacitor 131-2 with current, which is the other of the two capacitors of the SAR ADC 114, via the switch 113-2.

The PD 112 includes a flip-flop circuit. The PD 112 generates a phase difference signal $\phi_F$ of the reference frequency signal Fref and the DCO frequency signal Fdco. The PD 112 outputs the generated phase difference signal $\phi_F$ to the switch 113-1. Consequently, the switch 113-1 is turned on only while the phase difference signal $\phi_F$ is provided. When the switch 113-1 is turned on, the capacitor 131-1 is charged with current from the current source 111, and a voltage $V_F$ is generated in the capacitor 131-1.

After the charging of the capacitor 131-1 with current from the current source 111, the DCO frequency signal Fdco is provided to the switch 113-2 for one period (one clock). Consequently, the switch 113-2 is turned on for one period (one clock) of the DCO frequency signal Fdco. When the switch 113-2 is turned on, the capacitor 131-2 is charged with current from the current source 111, and a voltage $V_{RAMP}$ is generated in the capacitor 131-2.

The SAR ADC 114 outputs an AD conversion result based on the result of comparison between the voltage $V_F$ generated in the capacitor 131-1 and the voltage $V_{RAMP}$ generated in the capacitor 131-2.

The SAR ADC 114 includes a comparator 121, a SAR logic circuit 122, the capacitor 131-1, the capacitor 131-2, an inverter 132-1, and an inverter 132-2.

The comparator 121 compares the voltage $V_F$/the voltage $V_{RAMP}$ and outputs the comparison result (H/L) to the SAR logic circuit 122.

The SAR logic circuit 122 performs an operation on the comparison result provided from the comparator 121, and outputs the operation result to the outside (not illustrated). The SAR logic circuit 122 controls the inverters 132-1 and 132-2 to control the H/L of the capacitors 131-1 and 131-2.

The capacitance of the capacitor 131-1 is C1, and the capacitance of the capacitor 131-2 is C2 (C1:C2=1:1).

The inverter 132-1 controls the H/L of the capacitor 131-1 on the basis of the control of the SAR logic circuit 122. The inverter 132-2 controls the H/L of the capacitance of the capacitor 131-2 on the basis of the control of the SAR logic circuit 122.

Note that the pair of the capacitor 131-1 and the inverter 132-1 and the pair of the capacitor 131-2 and the inverter 132-2 may each be one of a plurality of pairs. However, the capacitance ratio between the pair of the capacitor 131-1 and the inverter 132-1 and the pair of the capacitor 131-2 and the inverter 132-2 is 1:1.

<Operation of TDC Circuit>

Figure 8:
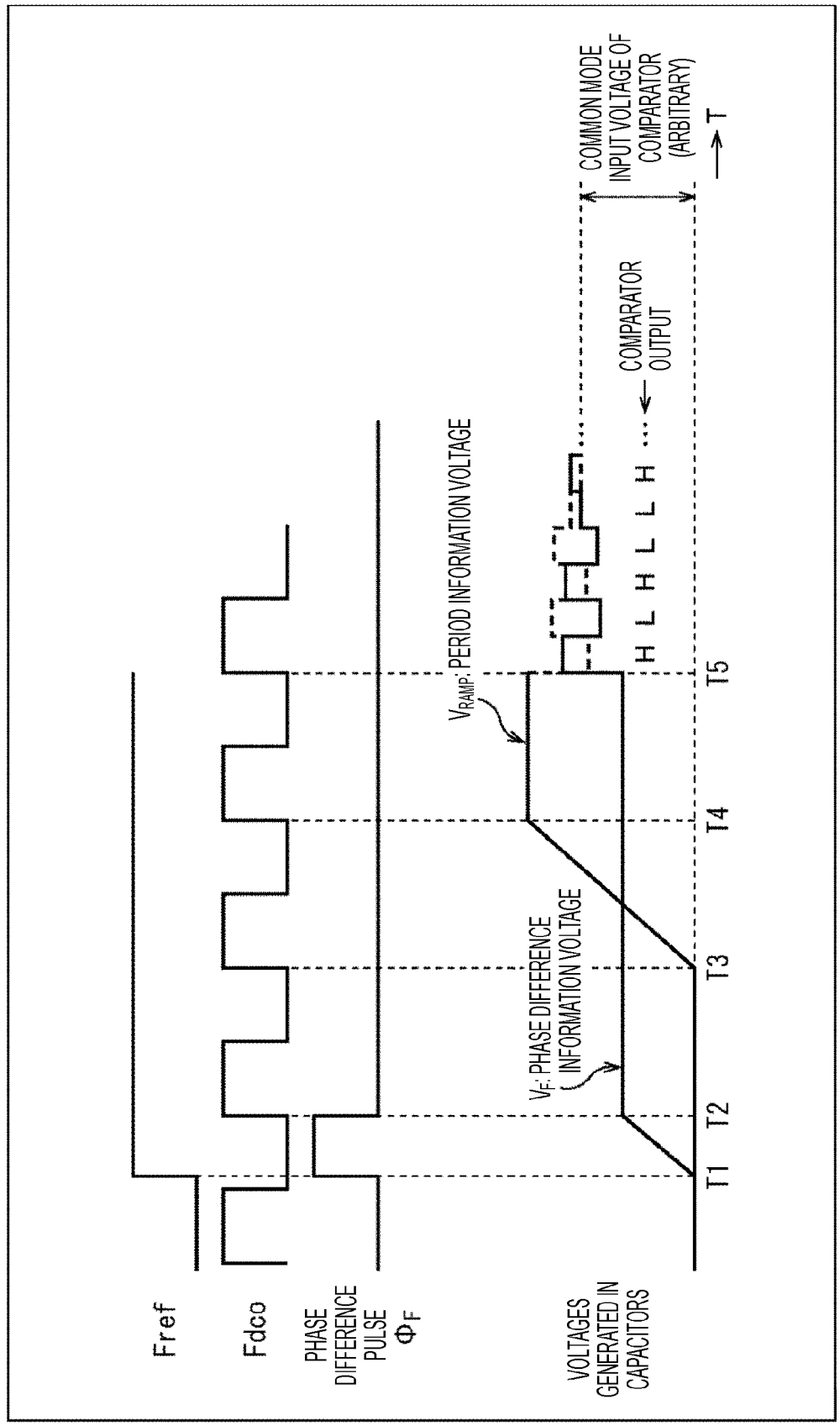
FIG. 8 is a diagram illustrating the operation of the TDC circuit in FIG. 7.

FIG. 8 is a diagram illustrating the operation of the TDC circuit in FIG. 7.

FIG. 8 illustrates, in the order from top, a signal waveform of the reference frequency signal Fref, a signal waveform of the DCO frequency signal Fdco, a signal waveform of the phase difference signal $\phi_F$, a Slope of the voltage $V_F$ generated in the capacitor 131-1 (C1), and a Slope of the voltage $V_{RAMP}$ generated in the capacitor 131-2 (C2).

While the phase difference signal $\phi_F$ is provided from the time T1 of a rising edge of the reference frequency signal Fref, the switch 113-1 is turned on. The capacitor 131-1 is charged with current from the current source 111, and the voltage $V_F$ is generated in the capacitor 131-1. After a wait of one period, the DCO frequency signal Fdco is provided for one period from the time T3 of a subsequent rising edge of the DCO frequency signal Fdco, so that the switch 113-2 is turned on. The capacitor 131-2 is charged with current from the current source 111, and the voltage $V_{RAMP}$ is generated in the capacitor 131-2.

After that, the SAR logic circuit 122 controls the inverters 132-1 and 132-2 from the time T5 of a subsequent rising edge to control the H/L of the capacitors 131-1 and 131-2. Thus, after the voltages are once generated, the values of the voltage $V_F$ and the voltage $V_{RAMP}$ are successively compared in the comparator 121, and the comparison results are output like, for example, H, L, H, L, L, H, . . . .

Note that the median value of the voltage $V_F$ and the voltage $V_{RAMP}$ is the common mode input voltage of the comparator (arbitrary).

As described above, in the present technology, the capacitance ratio between the capacitors 131-1 and 131-2 is 1:1, and furthermore, the SAR-ADC is used. Consequently, for the conventional operation to obtain a full-scale voltage at the time of AD conversion corresponding to the voltage $V_{RAMP}$, it is sufficient to operate the current source only for one period (one clock) of the DCO frequency signal Fdco. Therefore, it is possible to obtain a high intermittent rate with respect to the period of the reference frequency signal Fref, and the intermittent rate does not depend on the magnitude of the phase difference between the reference frequency signal Fref and the DCO frequency signal Fdco.

Here, it has been described that the current source is operated for one clock of the DCO frequency signal Fdco, but it may be operated for any number of clocks not less than one clock.

On the other hand, the conventional TDC circuits described above with reference to FIGS. 3 to 5 need to operate the current source for two clocks or more of the DCO frequency signal Fdco in order to obtain the voltage $V_{RAMP}$. Furthermore, in the conventional TDC circuits, if the phase difference between the reference frequency signal Fref and the DCO frequency signal Fdco is large, the period during which the current source is operated to obtain the voltage $V_{RAMP}$ can be extended, reducing the intermittent rate in one period of Fref. Therefore, the TDC circuit of the present technology is superior to the conventional TDC circuits in that it can operate at lower power.

<First Modification>

Figure 9:
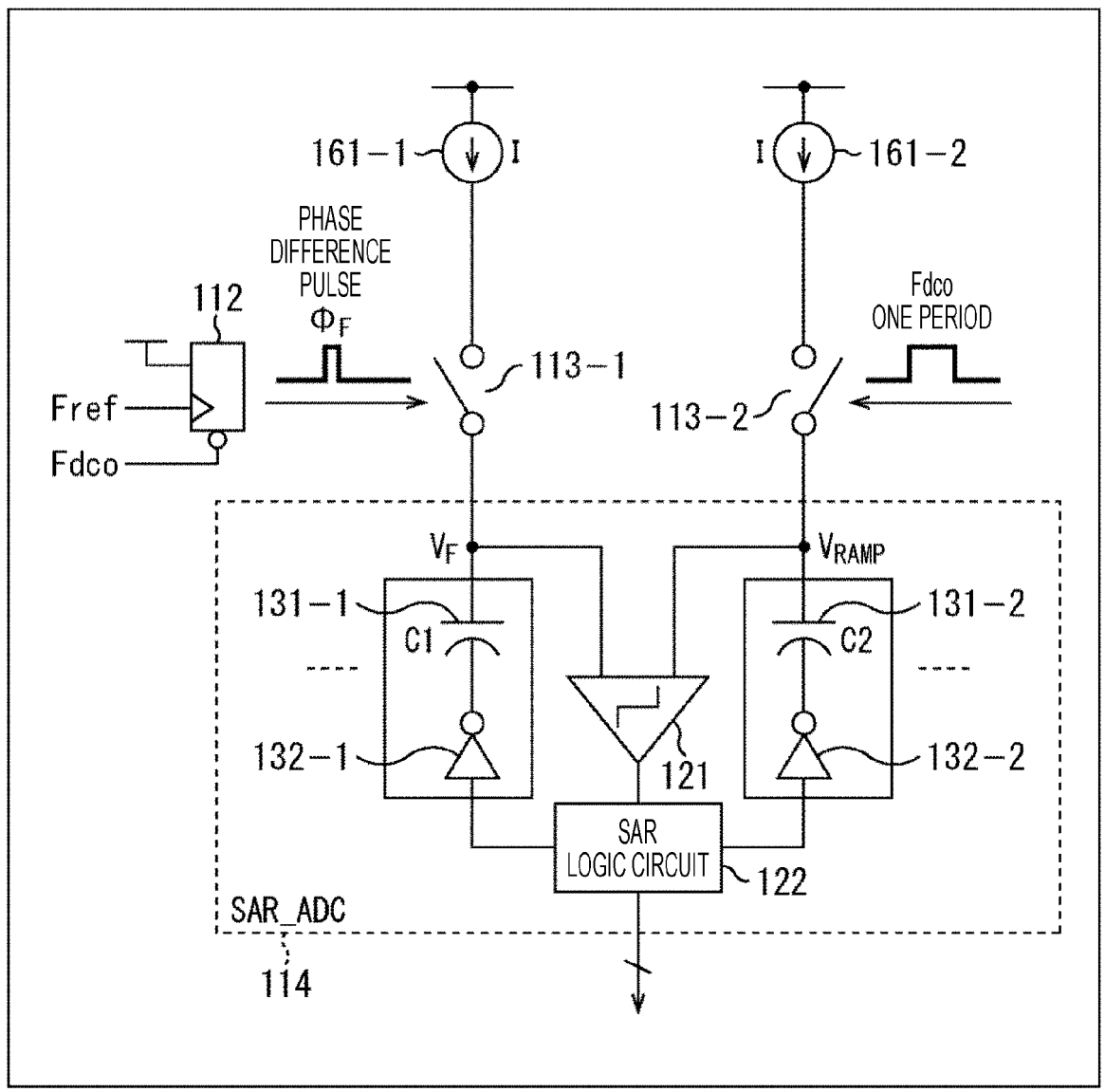
FIG. 9 is a circuit diagram illustrating a first modification of the TDC circuit in FIG. 7.

FIG. 9 is a circuit diagram illustrating a first modification of the TDC circuit in FIG. 7.

The TDC circuit 12 of FIG. 9 differs from the TDC circuit 12 of FIG. 7 in that current sources 161-1 and 161-2 are added instead of the current source 111. The rest of the configuration is basically similar to the configuration of FIG. 7, and thus will not be described.

The current sources 161-1 and 161-2 have a current mirror ratio of 1:1, and charge the capacitors 131-1 and 131-2 with current, respectively.

<Operation of TDC Circuit>

Figure 10:
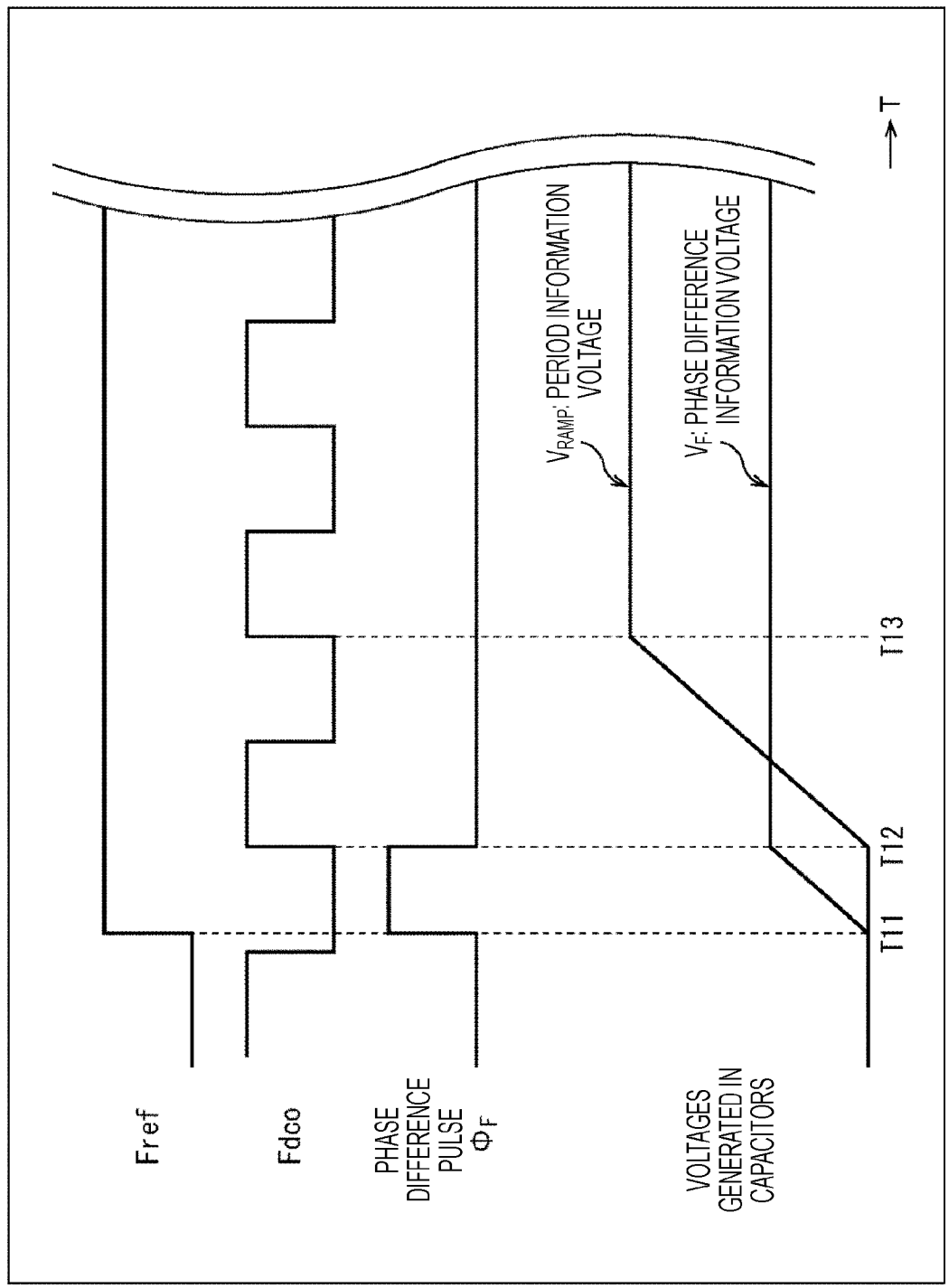
FIG. 10 is a diagram illustrating the operation of the TDC circuit in FIG. 9.

FIG. 10 is a diagram illustrating the operation of the TDC circuit in FIG. 9.

FIG. 10 illustrates, in the order from top, a signal waveform of the reference frequency signal Fref, a signal waveform of the DCO frequency signal Fdco, a signal waveform of the phase difference signal $\phi_F$, a Slope of the voltage $V_F$ generated in the capacitor 131-1 (C1), and a Slope of the voltage $V_{RAMP}$ generated in the capacitor 131-2 (C2).

While the phase difference signal $\phi_F$ is provided from the time T11 of a rising edge of the reference frequency signal Fref, the switch 113-1 is turned on. The capacitor 131-1 is charged with current from the current source 161-1, and the voltage $V_F$ is generated in the capacitor 131-1. The DCO frequency signal Fdco is provided for one period from the time T12 of a rising edge of the DCO frequency signal Fdco immediately thereafter, so that the switch 113-2 is turned on. The capacitor 131-2 is charged with current from the current source 161-2, and the voltage $V_{RAMP}$ is generated in the capacitor 131-2.

The operation of the TDC circuit after the generation of the voltages is basically similar to that of the example of FIG. 8, and thus the description thereof will be omitted.

As described above, the TDC circuit of FIG. 9 can perform charging of the voltage $V_F$ and the voltage $V_{RAMP}$ at the same time without waiting for one period for current charging of the voltage $V_{RAMP}$, and thus can obtain an AD conversion result faster than the TDC circuit of FIG. 7.

<Second Modification>

Figure 11:
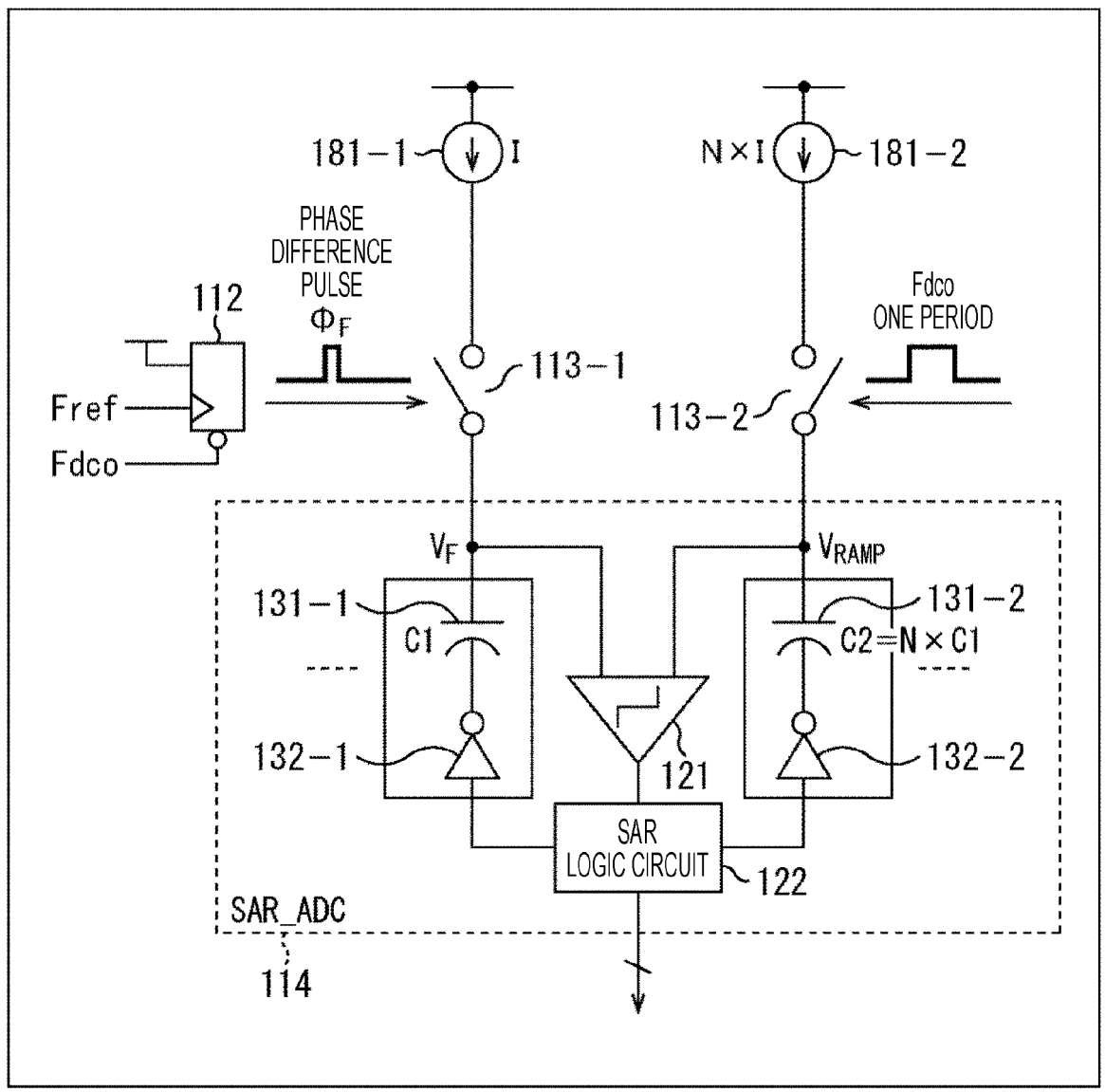
FIG. 11 is a circuit diagram illustrating a second modification of the TDC circuit in FIG. 7.

FIG. 11 is a circuit diagram illustrating a second modification of the TDC circuit in FIG. 7.

The TDC circuit 12 of FIG. 11 differs from the TDC circuit 12 of FIG. 7 in that the capacitances of the capacitors 131-1 and 131-2 are 1:N, and current sources 181-1 and 181-2 are added instead of the current source 111. The rest of the configuration is basically similar to the configuration of FIG. 7, and thus will not be described.

That is, the current sources 181-1 and 181-2 have a current mirror ratio of 1:N, and charges the capacitor 131-1 having a capacitance C1 and the capacitor 131-2 having a capacitance C2 (=N×C1) with current, respectively.

<Operation of TDC Circuit>

Figure 12:
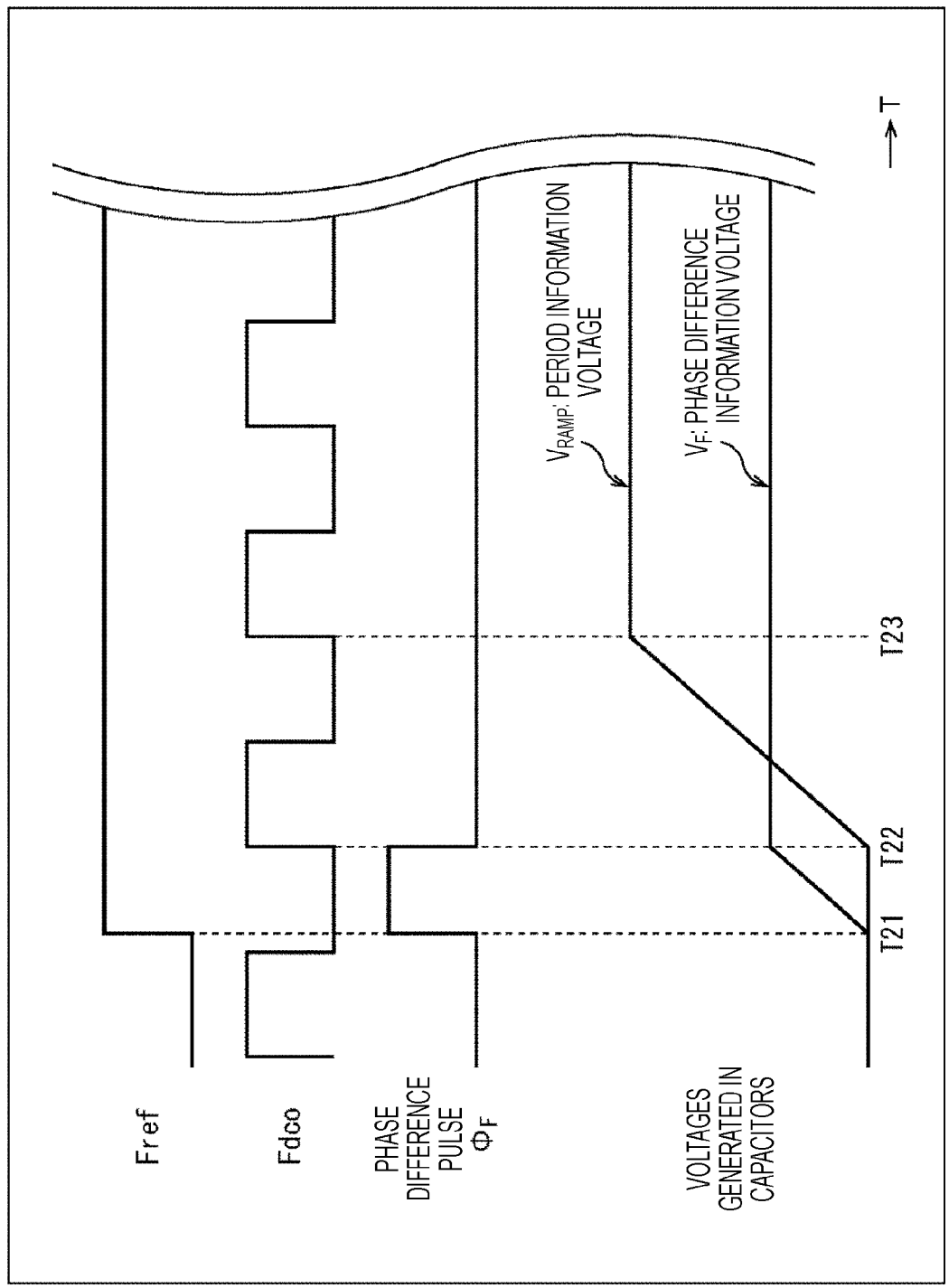
FIG. 12 is a diagram illustrating the operation of the TDC circuit in FIG. 11.

FIG. 12 is a diagram illustrating the operation of the TDC circuit in FIG. 11.

FIG. 12 illustrates, in the order from top, a signal waveform of the reference frequency signal Fref, a signal waveform of the DCO frequency signal Fdco, a signal waveform of the phase difference signal $\phi_F$, a Slope of the voltage $V_F$ generated in the capacitor 131-1 (C1), and a Slope of the voltage $V_{RAMP}$ generated in the capacitor 131-2 (C2).

While the phase difference signal $\phi_F$ is provided from the time T21 of a rising edge of the reference frequency signal Fref, the switch 113-1 is turned on. The capacitor 131-1 is charged with current from the current source 181-1, and the voltage $V_F$ is generated in the capacitor 131-1. The DCO frequency signal Fdco is provided for one period from the time T22 of a rising edge of the DCO frequency signal Fdco immediately thereafter, so that the switch 113-2 is turned on. The capacitor 131-2 is charged with current from the current source 181-2, and the voltage $V_{RAMP}$ is generated in the capacitor 131-2.

After the generation of the voltages, it is basically similar to the example of FIG. 8, and thus the description thereof will be omitted.

As described above, the TDC circuit of FIG. 11 can perform charging of the voltage $V_F$ and the voltage $V_{RAMP}$ at the same time without waiting for one period for current charging of the voltage $V_{RAMP}$, and thus can obtain an AD conversion result faster than the TDC circuit of FIG. 7.

According to the present technology, a time for current charging from a current source can be shortened to improve the intermittent rate, allowing power reduction.

The phase-locked loop of the present technology is used, for example, in a high-frequency wireless communication device.

2. Second Embodiment

<Configuration Example of Wireless Communication Device>

Figure 13:
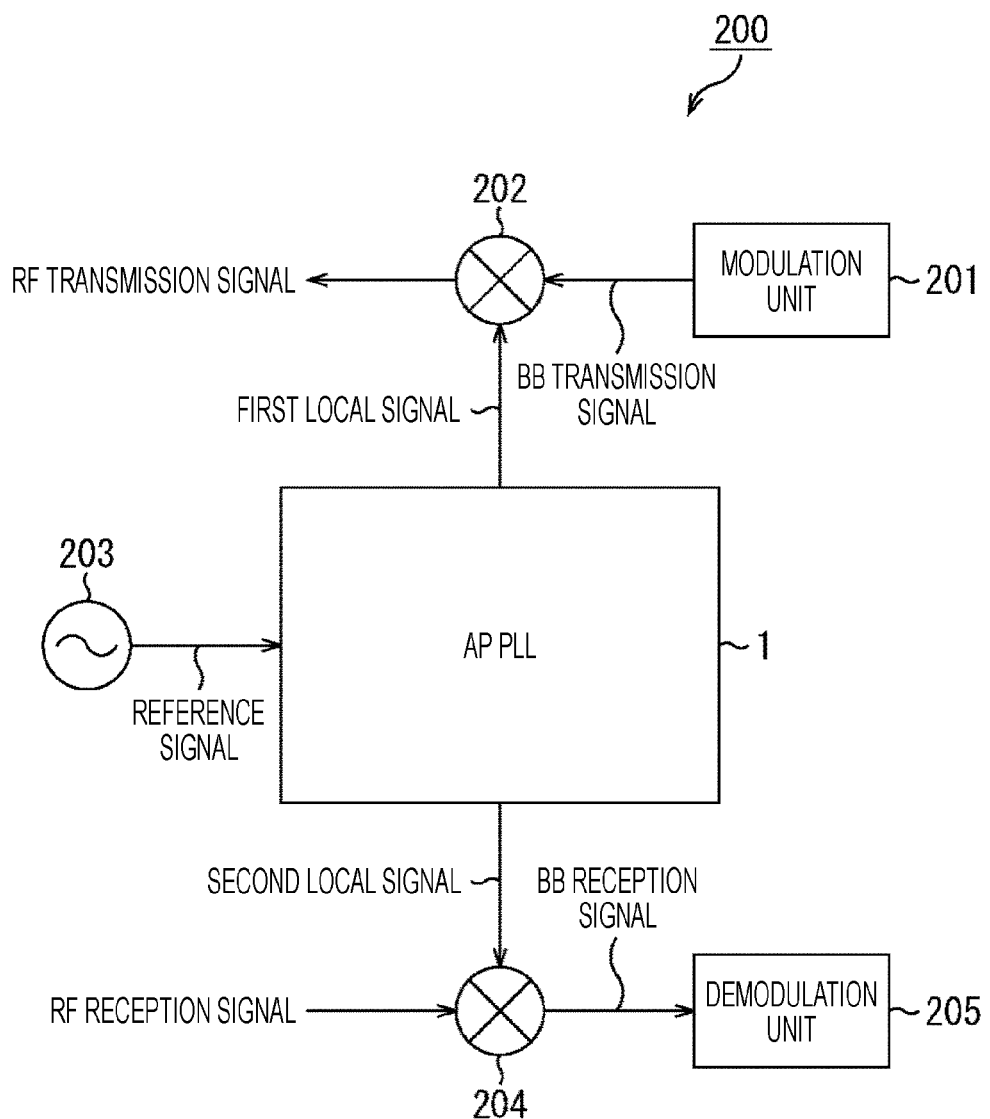
FIG. 13 is a block diagram illustrating a configuration example of a wireless communication device including the ADPLL.

FIG. 13 is a block diagram illustrating a configuration example of a wireless communication device 200 including the ADPLL 1. The wireless communication device 200 includes the ADPLL 1, a modulation unit 201, a transmission mixer 202, a reference signal oscillator 203, a reception mixer 204, and a demodulation unit 205.

The ADPLL 1 outputs a first local signal and a second local signal of a desired frequency to the transmission mixer 202 and the reception mixer 204, respectively, on the basis of a reference signal output from the reference signal oscillator 203. Note that the reference signal oscillator 203 is configured using, for example, a crystal oscillator.

The transmission mixer 202 is provided with a baseband transmission signal modulated by the modulation unit 400 and the first local signal output by the ADPLL 1. The transmission mixer 202 up-converts the baseband transmission signal (BB transmission signal) into a high-frequency transmission signal (RF transmission signal) on the basis of the transmission signal and the first local signal provided. Note that the high-frequency transmission signal is transmitted via an antenna not illustrated in FIG. 13.

Note that in the above description, an example of use in the wireless communication device has been described, but the present technology is not limited to the wireless communication device and can be applied to an RF circuit and the like.

Furthermore, the effects described in the present description are merely examples and nonlimiting, and other effects may be included.

Embodiments of the present technology are not limited to the above-described embodiments, and various modifications can be made without departing from the scope of the present technology.

Although the preferred embodiments of the present disclosure have been described in detail above with reference to the accompanying drawings, the present disclosure is not limited to these examples. It is obvious that a person having ordinary knowledge in the technical field to which the present disclosure belongs can arrive at various alterations or modifications within the scope of the technical idea described in the claims. These are, of course, considered to belong to the technical scope of the present disclosure.

Note that the present technology can also take on the following configurations.

(1)

A phase-locked loop including:

a SAR-ADC that includes two capacitors and outputs a result of comparison between voltages generated from the two capacitors;

a current source that charges the two capacitors with current;

a first switch that is disposed between one of the two capacitors and the current source and is provided with a phase difference between a first clock of a reference frequency and a second clock having a higher frequency than the first clock; and a second switch that is disposed between another of the two capacitors and the current source and is provided with the second clock.

(2)

The phase-locked loop according to the above (1), in which the current source charges the one capacitor with current for a time corresponding to the phase difference, on the basis of operation of the first switch, and charges the another capacitor with current for a time corresponding to the second clock, on the basis of operation of the second switch.

(3)

The phase-locked loop according to the above (2), in which the time corresponding to the second clock is a time of one clock period or more.

(4)

The phase-locked loop according to any one of the above (1) to (3), in which the one capacitor generates a voltage corresponding to the phase difference, and the another capacitor generates a voltage corresponding to the second clock.

(5)

The phase-locked loop according to the above (4), in which a ratio in capacitance between the one capacitor and the another capacitor is 1:1.

(6)

The phase-locked loop according to the above (4), in which the current source includes a first current source that charges the one capacitor with current, and a second current source that charges the another capacitor with current.

(7)

The phase-locked loop according to the above (6), in which the another capacitor has N times a capacitance of the one capacitor, and the second current source charges the another capacitor with N times a current of the first current source.

REFERENCE SIGNS LIST

1 ADPLL
11 Counter circuit
12 TDC circuit
13 Digital arithmetic circuit
14 VCO
111 Current source
112 PD
113-1 and 113-2 Switch
114 SAR ADC
121 Comparator
122 SAR logic circuit
131-1 and 131-2 Capacitor
132-1 and 132-2 Inverter
161-1 and 161-2 Current source
181-1 and 181-2 Current source
200 Wireless communication device
201 Modulation unit
202 Transmission mixer
203 Reference signal oscillator
204 Reception mixer
205 Demodulation unit

The invention claimed is:

1. A phase-locked loop comprising:
a SAR-ADC including a first capacitor and a second capacitor and configured to output a result of comparison between voltages generated from the first and second capacitors;
a current source that charges the first and second capacitors with current;
a first switch that is disposed between the first capacitor and the current source and that receives, as a first control signal, a phase difference between a first clock of a reference frequency and a second clock having a higher frequency than the first clock; and
a second switch that is disposed between the second capacitor and the current source and that receives, as a second control signal, the second clock.

2. The phase-locked loop according to claim 1, wherein the current source charges the first capacitor with current for a time corresponding to the phase difference, on a basis of operation of the first switch, and charges the second capacitor with current for a time corresponding to the second clock, on a basis of operation of the second switch.

3. The phase-locked loop according to claim 2, wherein the time corresponding to the second clock is a time of one clock period or more.

4. The phase-locked loop according to claim 2, wherein the first capacitor generates a voltage corresponding to the phase difference, and the second capacitor generates a voltage corresponding to the second clock.

5. The phase-locked loop according to claim 4, wherein a ratio in capacitance between the first capacitor and the second capacitor is 1:1.

6. The phase-locked loop according to claim 4, wherein
the current source comprises a first current source that
charges the first capacitor with current, and a second
current source that charges the second capacitor with
current.

7. The phase-locked loop according to claim 6, wherein
the second capacitor has N times a capacitance of the first
capacitor, and
the second current source charges the second capacitor
with N times a current of the first current source.

* * * * *